(12) United States Patent
Harris et al.

(10) Patent No.: US 6,563,696 B1
(45) Date of Patent: May 13, 2003

(54) SOLDERLESS LASER ASSEMBLY

(75) Inventors: David B. Harris, Columbia, MD (US); Edward J. Jablonski, Cockeysville, MD (US); Thomas A. Walter, Ellicott City, MD (US); Richard L. Anderson, Jr., Eldersburg, MD (US)

(73) Assignee: Ciena Corporation, Linthicum, MD (US)

( * ) Notice: Subject to any disclaimer, the term of this patent is extended or adjusted under 35 U.S.C. 154(b) by 21 days.

(21) Appl. No.: 09/981,050

(22) Filed: Oct. 17, 2001

(51) Int. Cl.[7] .................................................. H05K 7/20
(52) U.S. Cl. ........................ 361/619; 361/704; 361/707; 361/760; 257/675; 257/706; 257/718; 174/16.3; 165/80.3; 165/185
(58) Field of Search ................................ 361/704, 707, 361/719–722, 760, 761; 257/675, 706, 713, 722; 174/16.1, 16.3; 165/80.3, 185

(56) References Cited

U.S. PATENT DOCUMENTS

| | | | | |
|---|---|---|---|---|
| 4,731,693 A | * | 3/1988 | Berg et al. ................... | 361/719 |
| 4,933,808 A | | 6/1990 | Horton et al. ............... | 361/336 |
| 4,985,805 A | * | 1/1991 | Riedel et al. ................ | 361/704 |
| 5,109,320 A | | 4/1992 | Bourdelaise et al. ........ | 361/413 |
| 5,298,686 A | | 3/1994 | Bourdelaise et al. ........ | 174/254 |
| 5,924,290 A | * | 7/1999 | Yoshino ....................... | 62/3.7 |
| 5,960,535 A | * | 10/1999 | Rubens et al. ................ | 29/832 |

* cited by examiner

Primary Examiner—Boris Chervinsky
(74) Attorney, Agent, or Firm—Michael R. Cammarata

(57) ABSTRACT

A connect and disconnect assembly for connecting and disconnecting a laser diode having leads to a printed circuit board (PCB). The assembly includes a heatsink that connects with the printed circuit board by providing cap screws through the PCB which are threadably received in spacers connected to the heatsink. A connection assembly made up of a retainer block and screws connects the laser diode to the heatsink. The laser diode is provided through a cutout portion of the PCB, and connects to the heatsink by providing the screws through the retainer block and the laser diode, the screws being threadably received in the heatsink. A pair of fuzz button carriers are interposed between the laser diode and the PCB. Each fuzz button carrier has a body portion, spaced guide portions extending above the body portion, and fuzz buttons extending through the body portion. When the laser diode is connected to the heatsink, the laser diode leads are provided between the guide portions of the fuzz button carriers and contact the fuzz buttons. The fuzz buttons, in turn, electrically connect the laser diode leads to the PCB pads. The assembly provides a convenient mechanism for connecting/disconnecting the laser diode and heatsink to/from the PCB. Further, the laser diode and assembly can be easily disconnected from the PCB so that a modified, repaired, and/or updated laser diode or other component can be quickly and easily inserted into the circuit without damaging or destroying the laser diode or the PCB.

14 Claims, 2 Drawing Sheets

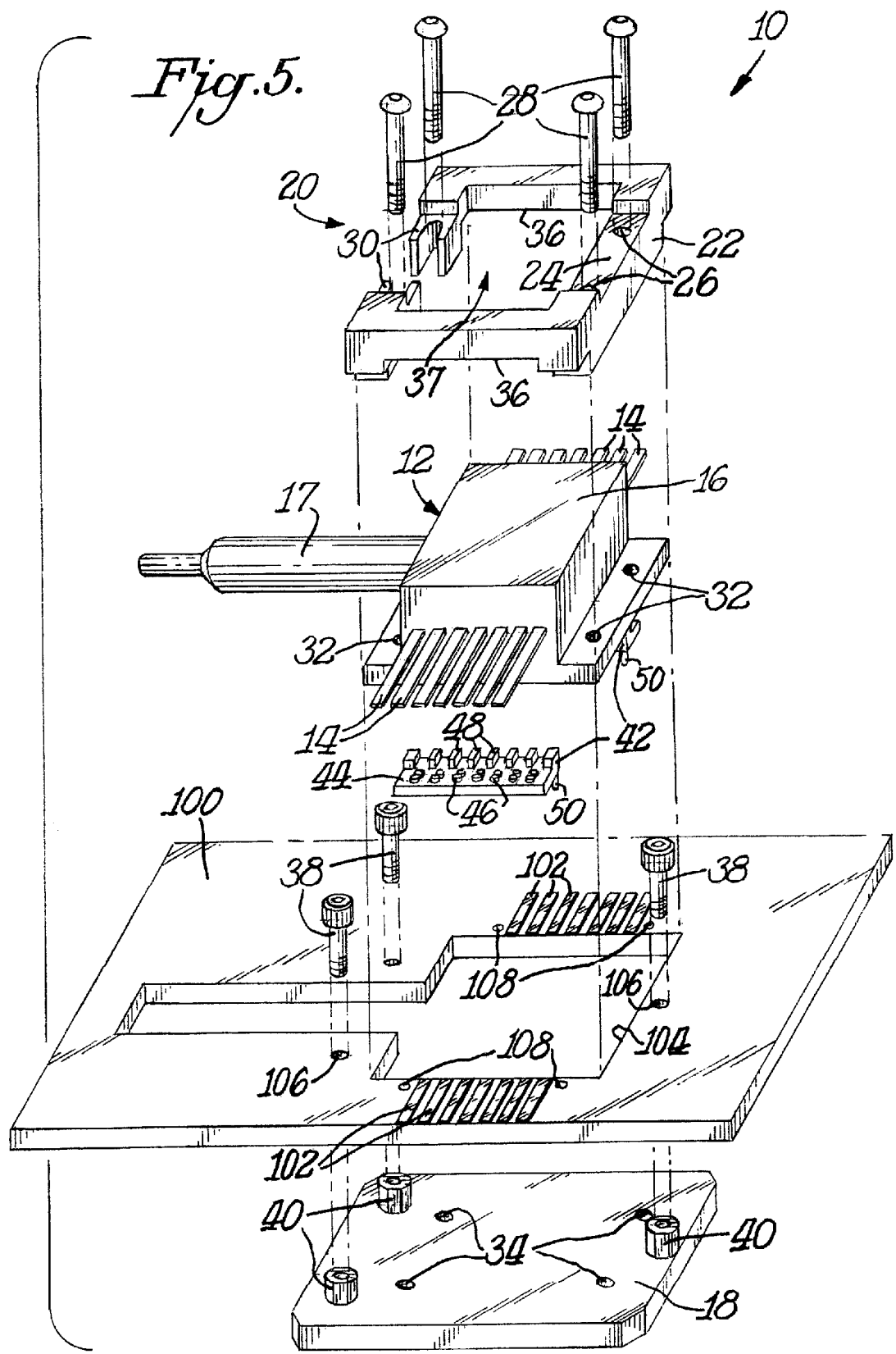

SOLDERLESS LASER ASSEMBLY

BACKGROUND OF THE INVENTION

A. Field of the Invention

The present invention relates generally to the communications field, and, more particularly to a solderless assembly for quickly connecting and disconnecting a laser assembly made up of a laser diode and a heatsink to a printed circuit board (PCB) used in the communications field.

B. Description of the Related Art

Printed circuit board (PCB) assemblies are used in computers, communications equipment, televisions, and many other products. In a typical PCB assembly, many electrical components are attached to the top and bottom surfaces of a PCB. Since the electronics manufacturing industry is highly competitive, it is important to maximize the throughput of processing PCB assemblies and to attach functional electrical components to the PCBs.

The manufacturing of PCB assemblies involves many processes, one of which is surface mounting components to PCBs. In addition to maximizing the throughput of processing PCB assemblies, it is also becoming important to accurately mount a large number of very small components to the PCB assemblies.

One major problem in mounting components on PCBs and the like is the connect/disconnect function. It is important that various components of the system be removable and/or possible to disconnect so that normal maintenance and testing, as well as changes and updates to the system, can be accomplished. Sometimes components that are permanently mounted onto a PCB (typically via soldering) may be defective. If such permanently-attached components are found to be defective, it is difficult to remove such components for repair without damaging or destroying the component and/or the PCB. Thus, it is essential that such components be easily removed from a PCB, without damaging or destroying the PCB, especially in the case where the component is defective.

One component that is typically permanently fixed (usually via soldering) onto a PCB is a laser diode. A laser diode, also known as an injection laser or diode laser, is a semiconductor device that produces coherent radiation at a center wavelength when current passes through it. Laser diodes are used in, for example, optical fiber systems, compact disc (CD) players, laser printers, remote-control devices, and intrusion detection systems.

Conventionally, a laser diode is provided with a heatsink on either a top or bottom surface of the laser diode. A heatsink is typically just a piece of metal that dissipates the heat generated by an optical or electronic component. There are three ways an object can dissipate heat: radiation, conduction, and convection.

Radiation, as the name suggests, means that the heat is simply radiated away from the object, through electromagnetic radiation (photon transport). This effect is not bound to gas or other substances surrounding the heatsink. Radiation will even take place in a vacuum. How well an object can radiate heat depends upon the material and the color.

Conduction is the exchange of kinetic energy between molecules. Less energetic (lower temperature) particles gain kinetic energy by colliding with more energetic particles (through physical contact). Since direct contact is required, a heatsink (surrounded by air) cannot get rid of significant amounts of heat using conduction. However, conduction is the effect that is responsible for the heat transfer from the hot component to the heatsink.

Convection is heat transfer by movement of a heated substance (gas or liquid). This means that the heat is transferred to the molecules of the gas (or liquid) surrounding the hot object, and then transported away through movement of molecules. If the gas or liquid around the object is forced into movement (e.g. by a fan blowing air across a heatsink), then this is called forced convection.

In a conventional arrangement as described generally in U.S. Pat. No. 5,324,387, a laser diode connects to a heatsink (usually with solder or screws), the heatsink connects to the PCB (usually with solder or screws), and the leads of the laser diode are soldered to the PCB to electrically couple the laser diode to the PCB. Once a laser diode is electrically coupled to the PCB, it is desirous to test the laser diode to see if it is functional. If the laser diode is defective or nonfunctional, it is further desirable to remove and repair, or remove and replace the defective laser diode. Unfortunately, if the leads of the defective laser diode are permanently soldered to the PCB, it is very difficult to remove the laser diode from the PCB without damaging or destroying the laser diode and/or the PCB.

Thus, there is a significant need in the art to provide a mechanism that temporarily attaches and electrically connects/disconnects a laser diode (or other electrical or optical component) and a heatsink to a PCB.

SUMMARY OF THE INVENTION

The present invention solves the problems of the related art by providing a solderless assembly for quickly connecting and disconnecting a laser diode and a heatsink to a printed circuit board (PCB) used, for example, in the communications field.

In accordance with the purpose of the invention, as embodied and broadly described herein, the invention comprises an apparatus for connecting and disconnecting a laser diode having at least one lead to a first side of a printed circuit board, the laser diode extending through a cutout portion of the printed circuit board, comprising: a heatsink connected to a second side of the printed circuit board; a connection assembly connected to the first side of the printed circuit board and connecting the laser diode to said heatsink; a compressible contact carrier interposed between the laser diode and the printed circuit board, wherein a portion of a connection force provided by said connection assembly sandwiching the laser diode and said compressible contact carrier between the printed circuit board and said connection assembly, is transferred through the at least one lead of the laser diode, to said compressible contact carrier, and electrically connects the at least one lead of the laser diode with at least one pad of the printed circuit board.

Further in accordance with the purpose of the invention, as embodied and broadly described herein, the invention comprises a method of connecting a laser diode having at least one lead to a first side of a printed circuit board, the laser diode extending through a cutout portion of the printed circuit board, comprising: connecting a heatsink to a second side of the printed circuit board; interposing a compressible contact carrier between the laser diode and the printed circuit board; and connecting the laser diode to the heatsink, via a connection assembly, wherein a portion of a connection force provided by the connection assembly sandwiching the laser diode and the compressible contact carrier between the printed circuit board and the connection assembly, is transferred through the at least one lead of the laser diode, to the compressible contact carrier, and electrically connects the at least one lead of the laser diode with at least one pad of the printed circuit board.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. It is to be understood that both the foregoing general description and the following detailed description are exemplary and explanatory only and are not restrictive of the invention, as claimed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 5 is an exploded perspective view of the solderless laser assembly shown in FIGS. 1–4.

DETAILED DESCRIPTION OF THE PREFERRED EMBODIMENTS

Figure 2:
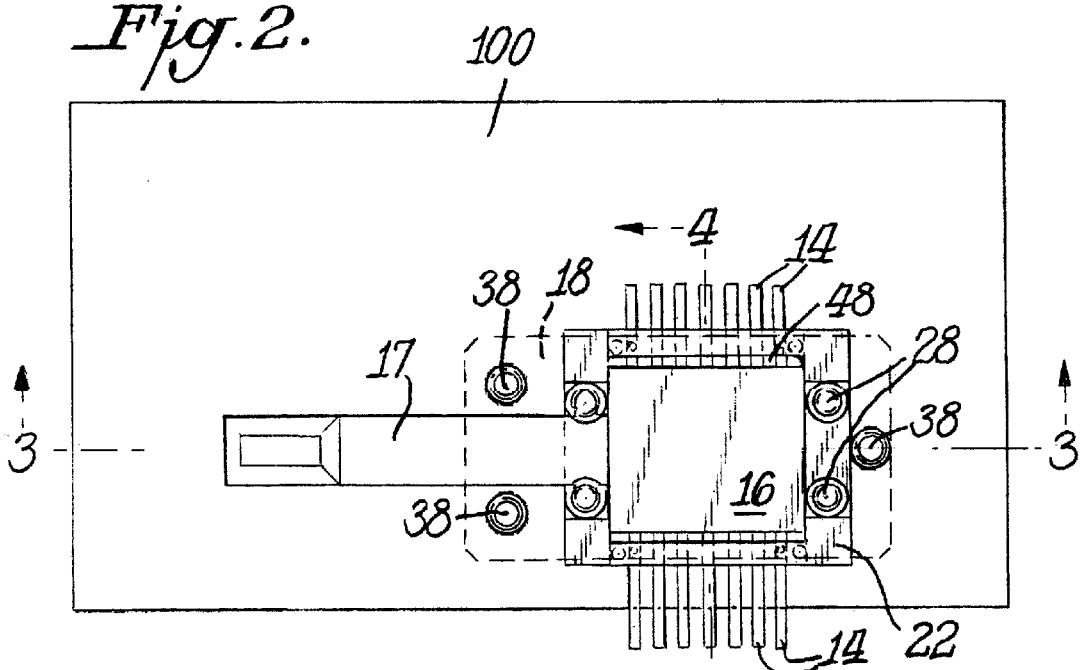
FIG. 2 is a top plan view of the solderless laser assembly shown in FIG. 1.

The following detailed description of the invention refers to the accompanying drawings. The same reference numbers in different drawings identify the same or similar elements. Also, the following detailed description does not limit the invention. Instead, the scope of the invention is defined by the appended claims and equivalents thereof.

Referring now specifically to the drawings, an embodiment of the solderless laser assembly of the present invention is illustrated in FIGS. 1–5, and shown generally as reference numeral 10. As generally shown in FIG. 5, assembly 10 includes a laser diode 12 having a multitude of leads 14 disposed on a laser body portion 16, and a heatsink 18. Laser diode 12 and heatsink 18 both connect to a printed circuit board (PCB) 100 having a multitude of pads 102 thereon. PCB 100 is provided between laser diode 12 and heatsink 18.

Laser diode 12 may connect to heatsink 18 and be provided on PCB 100 via various connection mechanisms. For example, laser diode 12 may connect to heatsink 18 with an adhesive, glue, or double-sided tape. As shown in FIG. 5, laser diode 12 may connect to heatsink 18 with a laser diode connection assembly 20. Connection assembly 20 preferably conforms to the dimensions (size, shape, etc.) of body portion 16 of laser diode 12, and thus includes a rectangular retaining block 22 that conforms to the dimensions of body portion 16 of laser diode 12. Retaining block 22 has a central opening 37 provided therein for receiving the body portion 16 of laser diode 12. One side of retaining block 22 includes a recess portion 24 having a pair of openings 26 for receiving a pair of screws 28. Another side of retaining block 22, opposite to the side with recess portion 24, has a pair of clips 30 for receiving another pair of screws 28. The space between clips 30 ensures that retaining block 22 does not interfere with a boot portion 17 of laser diode 12 that extends away from laser body portion 16. Boot portion 17 receives and protects a fiber optic cable (not shown) that may be connected to body portion 16.

The undersides of the two remaining sides of retaining block 22 also have recess portions 36 formed therein that engage and provide a connection force on laser leads 14, as described below. Screws 28 may be provided through openings 32 formed in laser body portion 16, through a cutout portion 104 of PCB 100, and threadably connect with openings 34 provided in heatsink 18.

Figure 3:
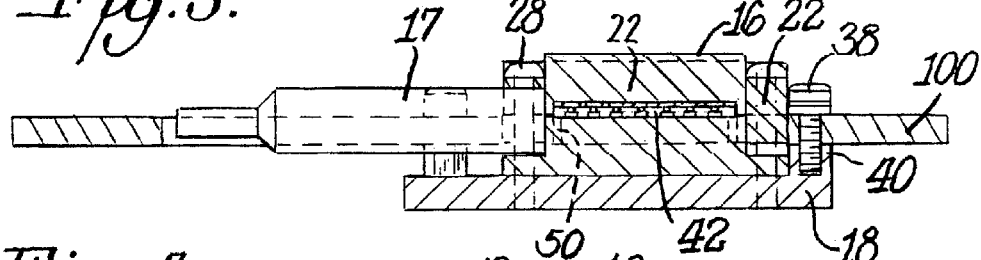
FIG. 3 is a longitudinal, cross-sectional view in elevation of the solderless laser assembly shown in FIGS. 1 and 2, taken along line 3—3 of FIG. 2.

PCB 100 may be additionally connected to heatsink 18 via various connection mechanisms. For example, PCB 100 may connect to heatsink 18 with an adhesive, glue, or double-sided tape. As shown in FIGS. 2, 3, and 5, PCB 100 may connect to heatsink 18 by providing three cap screws 38 through openings 106 of PCB 100 that are threadably received in spacers 38 connected to heatsink 18. Spacers 18 may be integrally formed with heatsink 18 or be connected to heatsink 18 with conventional fasteners.

Figure 1:
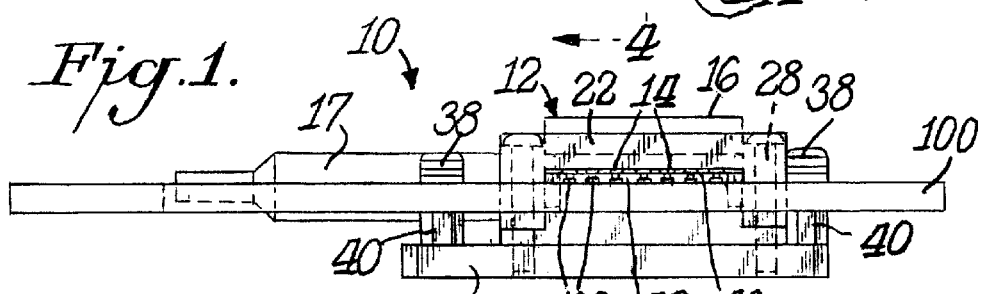
FIG. 1 is a side elevational view of a solderless laser assembly in accordance with an embodiment of the present invention, and shown attached to a printed circuit board (PCB)
Figure 4:
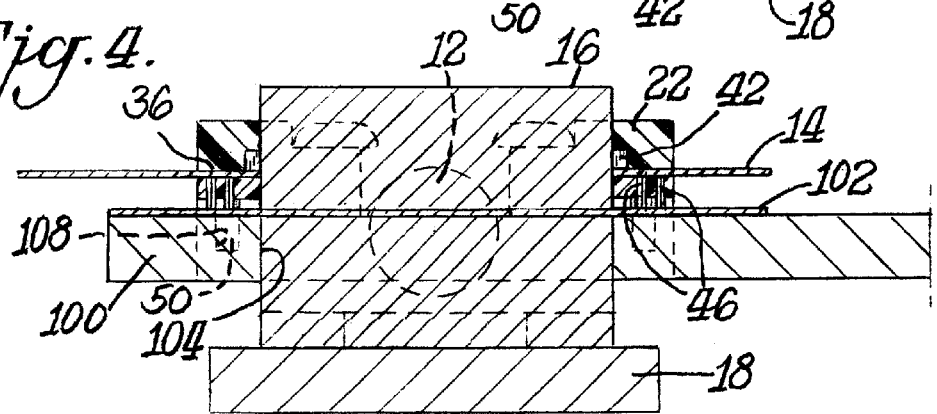
FIG. 4 is a transverse, cross-sectional view in elevation of the solderless laser assembly shown in FIGS. 1–3, taken along line 4—4 of FIG. 2.

As shown in FIGS. 1–5, a pair of compressible contact carriers or button carriers 42 may be provided on opposite sides of laser diode 12. As best shown in FIG. 5, each button carrier 42 includes a body portion 44 having multiple fuzz buttons 46 that align between and are spaced from guide portions 48 extending above the top of body portion 44. Locator pins 50 also extend below body portion 44, and align with and are received in openings 108 formed in PCB 100. Guide portions 48 are aligned and spaced on body portion 44 of each button carrier 42 so that each laser lead 14 may fit between two guide portions 48. Fuzz buttons 46 extend through body portion 44, and are provided at locations so that the portions of fuzz buttons 46 extending above body portion 44 engage corresponding laser leads 14 and the portions of fuzz buttons 46 extending below body portion 44 engage corresponding pads 102 on PCB 100. FIGS. 1, 3, and 4 show that two fuzz buttons 46 align with a corresponding laser lead 14 and a corresponding PCB pad 102, however, more or less than two fuzz buttons 46 may align with a corresponding laser lead 14 and a corresponding PCB pad 102. Two fuzz buttons 46 are preferably provided for each laser lead 14 and PCB pad 102 to augment the interconnection reliability.

Each fuzz button 46 is a small electrical contact element manufactured from a single strand of fine randomly-woven wire, typically gold-plated Molybdenum (Mo) or Beryllium copper wire, which is die compressed into a cylindrical form. Each strand of wire is typically 0.02 inches in diameter and 0.40 inches in length, although the diameter and length may vary. The random weave of the wire provides multiple connection points at the laser lead 14 and PCB pad 102 interfaces. The resulting object is a solderless wire mass that exhibits excellent spring characteristics and electrical performance. Such contacts are also known as compressible contacts, or compression-based, z-axis connectors. Fuzz buttons 46 are commercially available from Cinch Connector, Inc. of Lombard, Ill. under the trade name CIN:APSE®, and from Tecknit® USA of 129 Dermody Street, Cranford, N.J. 07016.

"Hardhat" contact pins (also available from Tecknit®) may be used in conjunction with fuzz buttons 46. Hardhat contact pins are miniature gold-plated Beryllium copper pins that come with a variety of tip styles. For example, typically four-point-crown tipped hardhats are utilized to contact solderballs, and serrated-tipped hardhats are utilized to contact flat pads. Other tip styles include concave, bullet-nosed, and pointed.

Although the Figures show only fuzz buttons 46, the present invention is not limited to fuzz buttons 46. Rather, the present invention may utilize a variety of compression-based, z-axis connectors or contacts, including but not limited to the following examples.

For example, fuzz button 46 may be replaced with AMP® high-performance spring-probe connectors available from Tyco Electronics® of Harrisburg, Pa. The spring-probe contact design provides a redundant internal current path for optimal electrical performance when exposed to vibration, motion, and mechanical shock.

Fuzz buttons 46 may also be replaced with Surface Stack™ connectors available from Teledyne Technologies, Inc. of Los Angeles, Calif. The Surface Stack™ connectors are designed to provide solderless, one-piece surface-mount solutions. Through the use of unique "pressure contacts" these connectors are able to eliminate the need for plated through holes and costly soldering operations.

In addition, fuzz buttons 46 may be replaced with uniaxially conductive elastomeric connectors, sold under the trade name Zebra® by Fujipoly® America Corporation of Carteret, N.J.

Body portion 44, guide portions 48, and locator pins 50 of button carriers 42 maybe made from a variety of materials, but preferably are made from a dielectric (electrically insulating) material. This way button carriers 42 isolate and do not interfere with the electrical connection established between fuzz buttons 46, laser leads 14, and PCB pads 102.

Connection assembly 20 may be made of a variety of materials, but preferably is also made from a dielectric (electrically insulating) material. This way connection assembly 20 also helps isolate and does not interfere with the electrical connection established between fuzz buttons 46, laser leads 14, and PCB pads 102.

Button carriers 42 are provided between laser diode 12 and PCB 100. Provision of connection assembly 20 is preferred since recess portions 36 of connection assembly 20 provide an even pressure or an even connection force on laser leads 14, as best shown in FIG. 4, so that laser leads 14 adequately contact and compress fuzz buttons 46. The force that compresses fuzz buttons 46 is also transferred to PCB pads 102, ensuring that fuzz buttons 46 adequately contact PCB pads 102.

Alternatively, connection assembly 20 need not be provided. Thus, laser diode 12 would connect directly to heatsink 18 by providing screws 28 through openings 32 formed in laser body portion 16 and cutout portion 104 of PCB 100, so that screws 28 threadably connect with openings 34 provided in heatsink 18. However, without connection assembly 20, the stiffness of the laser leads 14 would need to provide adequate force on fuzz buttons 46, which may be unlikely, and may fail to provide an even force on fuzz buttons 46. If the laser leads 14 are not stiff enough, without connection assembly 20, the laser leads 14 may bend when they contact fuzz buttons 46, and prevent adequate is contact with fuzz buttons 46.

As best shown in FIGS. 1 and 3, laser diode 12 and connection assembly 20 may be provided on a top side of PCB 100, heatsink 18 may be provided on a bottom side of PCB 100, and button carriers 42 are sandwiched between laser diode 12 and PCB 100. Alternatively, laser diode 12 and connection assembly 20 may be provided on the bottom side of PCB 100, and heatsink may be provided on a top side of PCB 100, while button carriers 42 are sandwiched between laser diode 12 and PCB 100.

Attachment of laser diode 12 to PCB 100 with connection assembly 20 enables laser leads 14 to adequately contact and compress corresponding fuzz buttons 46, and contact corresponding PCB pads 102, providing an electrical current from the PCB 100 to laser diode 12. That is, a portion of a connection force provided by the connection assembly's 20 sandwiching laser diode 12 and button carriers 42 between PCB 100 and connection assembly 20, is transferred through laser leads 14, to fuzz buttons 46 of button carriers 42, and couples laser leads 14 with corresponding PCB pads 102. This way, laser diode 12 may be tested without being permanently affixed to PCB 100.

Laser diode 12 may be a conventional laser diode that produces coherent radiation at a center wavelength when an electrical current passes through it. When solderless laser assembly 10 is provided on PCB 100, leads 14 may contact corresponding pads 102 on the PCB 100 to provide an electrical current from the PCB 100 to laser diode 12, via leads 14. Laser diode 12, in turn, converts the electrical current to an optical signal that may be provided to a fiber optic cable connected to laser diode 12.

As shown in FIGS. 1 and 3, heatsink 18 includes a base plate, and may have a plurality of heat dissipation fins (not shown) extending away from and integrally formed with the base plate. Heat dissipation fins would aid the process of dissipating heat generated by laser diode 12, and the number, size, shape, and arrangement of fins depends upon the desired heat dissipation to be provided by heatsink 18 for laser diode 12. The size and shape of the base plate of heatsink 18 also depends upon the desired heat dissipation to be provided. That is, the more surface area of the base plate, and the fins if provided, the more heat will be dissipated by heatsink 18. However, the desire to dissipate heat generated by laser diode 12 should be balanced with the desire not to overcool laser diode 12. Such a balance will depend upon the laser diode 12 selected, the environment in which the laser diode 12 is used, the output of laser diode 12, and desired thermal profile of laser diode 12.

As shown in FIGS. 2 and 5, heatsink 18 may be rectangular shaped, although heatsink 18 may have a variety of other shapes, including circular, trapezoidal, or square. Heatsink 18 need not have any particular dimensions, but should be sized to provide the desired heat dissipation for laser diode 12. A larger heatsink 18 provides more heat dissipation than a smaller heatsink 18, but heatsink 18 should not be so large that it takes up too much valuable space on PCB 100. Thus, the size of heatsink 18 will be application dependent.

Heatsink 18 may be made from a variety of materials. For example, heatsink 18 may be made of aluminum alloy due to its low cost, great mechanical characteristics, and light-weight nature. Although a pure metal has better thermal conductivity than an alloy, aluminum alloys have better mechanical characteristics than aluminum. Heatsink 18 may also be made from copper, copper alloy, a copper and aluminum combination, advanced ceramics such as Beryllium and aluminum nitride, or advanced composites such as aluminum silicon nitride, and thermal pyrolytic graphite.

In addition to these two factors, heatsink 18 may be designed in a such way that good thermal transfer is possible inside heatsink 16 (meaning that the heat can easily travel from the upper part of heatsink 18, that is in contact with laser diode 12, to the underside of heatsink 18, where the actual heat dissipation takes place). The part of heatsink 18 that is in contact with laser diode 12 should preferably be substantially flat in order to allow good thermal transfer. Typically, there will still be small air gaps in the contact area between laser diode 12 and heatsink 18. Therefore, a thermal interface material, like a thermal compound (paste) or a thermoconductive pad may be used between heatsink 18 and laser diode 12.

To temporarily connect laser diode 12, heatsink 18, and button carriers 42 to PCB 100, a user need only: connect heatsink 18 to PCB with cap screws 38; provide locator pins 50 of button carriers 42 in openings 108 of PCB 100; provide laser 12 in cutout portion 104 of PCB 100 while aligning laser leads 14 between guide portions 48 of button carriers 42; and connect laser diode 12 to heatsink 18 by providing screws 28 through openings 26 of retaining block 22, openings 32 of laser body portion 16, and into openings 34 of heatsink 18. Laser leads 14 align and contact with PCB pads 102 to electrically connect laser diode 12 to PCB 100. A fiber optic cable may then be optically connected to laser diode 12. The operability of laser diode 12 may then be tested, without permanently attaching laser diode 12 to PCB 100. If laser diode 12 is defective, it may be disconnected from PCB 100, and repaired or replaced, without damaging PCB 100 or laser diode 12.

To disconnect assembly 10, a user need only remove or loosen screws 28 provided in openings 34 of heatsink 18, remove connection assembly 20 from laser diode 12, and laser diode 12 from PCB 100. Heatsink 18 may then be disconnected from PCB 100 by removing or loosening cap screws 38. Button carriers 42 may also be disconnected from PCB 100 by removing locator pins 50, and thus, button carriers 42, from openings 108 of PCB 100.

Thus, the solderless laser assembly 10 of the present invention provides a very convenient mechanism for connecting/disconnecting a laser diode 12 and heatsink 18 to/from PCB 100 or the like, for testing laser diode 12. Further, laser diode 12 and assembly 10 can be easily disconnected from PCB 100 so that a modified, repaired, and/or updated components (e.g., a new or repaired laser diode 12), or components with different functions can be quickly and easily inserted into the circuit without damaging or destroying assembly 10 or PCB 100.

Once it is determined that laser diode 12 is operable, it may be permanently attached to PCB 100 by soldering leads 14 to corresponding pads 102 on PCB 100. Alternatively, the solderless laser assembly 10 may be used for permanently attaching laser diode 12 to PCB 100. If laser diode 12 subsequently becomes defective, assembly 10 permits removal of the defective laser diode 12 from PCB 100 without damage to PCB 100 and laser diode 12. Defective laser diode 12 may then be repaired (or replaced) and reconnected to PCB 100 with assembly 10.

Low power laser diodes in properly designed circuits do not degrade significantly during thousands of hours of use or when powered on or off. This does not mean that the laser diode itself is not gradually degrading in some way. Typically low power laser diodes (e.g., 5 mW laser diodes) have life expectancies of 10,000 hours or less. High power laser diodes may have considerably shorter life expectancies than low power laser diodes. High temperature operation of laser diodes can also reduce life expectancy, possibly by as much as a factor of two for each 10° C. rise above the temperature quoted in the diode's specifications.

Furthermore, the time to failure of laser diodes varies, meaning that some laser diode lifetimes will be significantly less than the 5,000 hour mean, and some will be much longer than the mean. The main life limiting factors in a laser diode are related to how many crystal defects are present in the device when it is made. Assembly 10 of the present invention enables testing of laser diodes that are approaching the ends of their useful lives. This way it can be determined if the performance of the laser diode is degrading, or if the laser diode has reached the end of its useful life.

It will be apparent to those skilled in the art that various modifications and variations can be made in the solderless laser assembly of the present invention and in construction of the assembly without departing from the scope or spirit of the invention. For example, the material selections discussed above are purely exemplary and not limiting of the embodiments of the present invention. The present invention is also not limited for use with a PCB, but may be used for coupling the assembly with integrated circuit (IC) chips, hybrid circuits, etc. Finally, the present invention may be used for components other than a laser diode, such as, for example, lasers with leads, photodiodes, etc. If a photodiode replaces laser diode 12, the photodiode would receive an optical signal from a fiber optic cable, and convert the optical signal into an electrical signal. The electrical signal would then travel through leads 14 and enter PCB 100 through pads 102. The present invention is also not limited to use in the communications field, and may be used with any laser that attaches to a PCB and needs to be tested before permanently being attached to the PCB.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An apparatus for connecting and disconnecting a laser diode having at least one lead to a first side of a printed circuit board, the laser diode extending through a cutout portion of the printed circuit board, comprising:
   a heatsink connected to a second side of the printed circuit board;
   a connection assembly connected to the first side of the printed circuit board and connecting the laser diode to said heatsink;
   a compressible contact carrier interposed between the laser diode and the printed circuit board, wherein a portion of a connection force provided by said connection assembly sandwiching the laser diode and said compressible contact carrier between the printed circuit board and said connection assembly, is transferred through the at least one lead of the laser diode, to said compressible contact carrier, and electrically connects the at least one lead of the laser diode with at least one pad of the printed circuit board.

2. An apparatus for connecting and disconnecting a laser diode as recited in claim 1, wherein said compressible contact carrier comprises a body portion having a plurality of fuzz buttons extending therethrough.

3. An apparatus for connecting and disconnecting a laser diode as recited in claim 2, wherein the body portion of said compressible contact carrier has at least two guides for receiving and retaining the at least one lead of the laser diode.

4. An apparatus for connecting and disconnecting a laser diode as recited in claim 3, wherein at least one fuzz button is aligned between and spaced from the at least two guides for receiving and retaining the at least one lead of the laser diode.

5. An apparatus for connecting and disconnecting a laser diode as recited in claim 2, wherein the body portion of said compressible contact carrier comprises a dielectric material.

6. An apparatus for connecting and disconnecting a laser diode as recited in claim 2, wherein at least one locator pin extends from the body portion of said compressible contact carrier, and is received and retained in an opening formed in the printed circuit board.

7. An apparatus for connecting and disconnecting a laser diode as recited in claim 2, wherein each fuzz button comprises a single strand of randomly-woven copper wire which is die compressed into a cylindrical form.

8. An apparatus for connecting and disconnecting a laser diode as recited in claim 1, wherein said connection assembly comprises a plurality of screws and a retainer block having a plurality of openings for receiving a corresponding screw, the plurality of screws being provided through the laser diode and being threadably received in openings of said heatsink to connect the laser diode to said heatsink.

9. An apparatus for connecting and disconnecting a laser diode as recited in claim 8, wherein the retainer block of said connection assembly includes a recess that presses the at least one lead of the laser diode against said compressible contact carrier.

10. An apparatus for connecting and disconnecting a laser diode as recited in claim 8, wherein the retainer block of said connection assembly comprises a dielectric material.

11. An apparatus for connecting and disconnecting a laser diode as recited in claim 8, wherein the retainer block of said connection assembly includes a gap on one side to accommodate a boot portion of the laser diode.

12. An apparatus for connecting and disconnecting a laser diode as recited in claim 8, wherein the retainer block of said connection assembly includes a central opening that receives and conforms to the dimensions of the laser diode.

13. An apparatus for connecting and disconnecting a laser diode as recited in claim 1, wherein said heatsink connects to the printed circuit board by providing cap screws through the printed circuit board that are threadably received and retained in spacers connected to said heatsink.

14. A method of connecting a laser diode having at least one lead to a first side of a printed circuit board, the laser diode extending through a cutout portion of the printed circuit board, comprising:

connecting a heatsink to a second side of the printed circuit board;

interposing a compressible contact carrier between the laser diode and the printed circuit board; and connecting the laser diode to the heatsink, via a connection assembly, wherein a portion of a connection force provided by the connection assembly sandwiching the laser diode and the compressible contact carrier between the printed circuit board and the connection assembly, is transferred through the at least one lead of the laser diode, to the compressible contact carrier, and electrically connects the at least one lead of the laser diode with at least one pad of the printed circuit board.

* * * * *